(12) United States Patent
Hatanaka et al.

(10) Patent No.: US 6,875,554 B2
(45) Date of Patent: Apr. 5, 2005

(54) POSITIVE PHOTOSENSITIVE POLYIMIDE RESIN COMPOSITION

(75) Inventors: Tadashi Hatanaka, Chiba (JP); Tomonari Nakayama, Chiba (JP); Takayasu Nihira, Chiba (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 0 days.

(21) Appl. No.: 10/381,736

(22) PCT Filed: Oct. 3, 2001

(86) PCT No.: PCT/JP01/08692

§ 371 (c)(1),
(2), (4) Date: Apr. 3, 2003

(87) PCT Pub. No.: WO02/29494

PCT Pub. Date: Apr. 11, 2002

(65) Prior Publication Data

US 2004/0048188 A1 Mar. 11, 2004

(30) Foreign Application Priority Data

Oct. 4, 2000 (JP) ........................................ 2000-304767

(51) Int. Cl.[7] .......................... G03F 7/004; G03F 7/038
(52) U.S. Cl. .................... 430/270.1; 430/154; 430/170; 430/189; 430/193
(58) Field of Search ............................. 430/270.1, 154, 430/170, 189, 193

(56) References Cited

U.S. PATENT DOCUMENTS

| | | | | | |
|---|---|---|---|---|---|
| 4,925,915 | A | * | 5/1990 | Mueller et al. | 528/353 |
| 5,288,588 | A | * | 2/1994 | Yukawa et al. | 430/192 |
| 6,677,099 | B1 | * | 1/2004 | Ishii et al. | 430/165 |

FOREIGN PATENT DOCUMENTS

| | | | |
|---|---|---|---|
| EP | 317943 | 5/1989 | |
| EP | 424940 | 5/1991 | |
| JP | 54-116216 | 9/1979 | |
| JP | 54-116217 | 9/1979 | |
| JP | 54-145794 | 11/1979 | |
| JP | 57-168942 | 10/1982 | |
| JP | 64-33133 | 2/1989 | |
| JP | 64-60630 | 3/1989 | |
| JP | 3-209478 | 9/1991 | |
| JP | 10-206627 | 8/1998 | |
| JP | 11-54270 | 2/1999 | |
| JP | 11-326625 | 11/1999 | |
| JP | 2000-187111 | 7/2000 | |
| WO | 01/40873 | 6/2001 | |
| WO | WO 200140873 A1 * | 6/2001 | ........... C08G/73/10 |

OTHER PUBLICATIONS

JP 64–60630 Abstract; Mueller et al.*
JP 64–33133 Abstract; Sasaki et al.*
U.S. Appl. No. 10/381,736, filed Apr. 3, 2003, Hatanaka et al.
U.S. Appl. No. 10/488,093, filed Mar. 5, 2004, Nakayama et al.

* cited by examiner

*Primary Examiner*—Yvette C. Thornton
(74) *Attorney, Agent, or Firm*—Oblon, Spivak, McClelland, Maier & Neustadt, P.C.

(57) ABSTRACT

A positive photosensitive polyimide resin composition comprising:
(a) a solvent-soluble polyimide comprised of from 1 to 100 mol % of a bivalent organic group derived from a diamine, that has at least one solvent solubilizing functional group, the polyimide having a reduced viscosity ranging from 0.05 to 5.0 dl/g,
(b) a photosensitive orthoquinonediazide compound, and
(c) from 0.1 to 50 wt %, based on the total weight of all polymers of the composition, of a component (c1) or (c2), wherein:
component (c1) is a solvent-soluble polyimide comprised of from 1 to 100 mol % of a bivalent organic group derived from a diamine, that has at least one functional group selected from the group consisting of a long chain alkyl group having at least 6 carbon atoms and a fluorinated alkyl group, the polyimide having a reduced viscosity ranging from 0.05 to 5.0 dl/g, and
component (c2) is a polyamic acid comprised of from 1 to 100 mol % of a bivalent organic group derived from a diamine, that has at least one functional group selected from the group consisting of a long chain alkyl group having at least 6 carbon atoms and a fluorinated alkyl group, the polyimide having a reduced viscosity ranging from 0.05 to 5.0 dl/g.

16 Claims, No Drawings

POSITIVE PHOTOSENSITIVE POLYIMIDE RESIN COMPOSITION

TECHNICAL FIELD

The present invention relates to a novel positive photosensitive resin composition obtained by improving the water repellency characteristics at the surface and imparting additional functions to a positive photosensitive resin which can be developed by an alkali aqueous solution and which is excellent in sensitivity and developability, while maintaining such properties. Such a positive photosensitive resin composition is particularly suitable for use as a light-shielding material or a partition wall material for an ink jet system in a liquid crystal display or in an EL display.

BACKGROUND ART

As a technique to impart photosensitivity to a polyimide resin, there is, for example, a method of chemically bonding a crosslinkable group to a soluble polyimide precursor as disclosed in JP-A-54-116216 or JP-A-54-116217, or a method of mixing a crosslinkable monomer as disclosed in JP-A-54-145794 or JP-A-57-168942.

The above methods are of a negative type wherein an exposed portion is crosslinked and insolubilized by light, and they have a problem in safety, since an organic solvent is employed for the development, and swelling of the exposed portion by the developer will take place, whereby it will be difficult to carry out fine processing with high resolution.

Whereas, recently, a positive photosensitive resin material which can be developed by an alkali aqueous solution, has been developed and has attracted an attention. As such a photosensitive resin composition, a composition having an orthoquinone diazide compound mixed to an organic solvent-soluble polyimide resin having hydroxyl groups introduced (JP-A-64-60630) or a photosensitive resin composition with a high resolution having a polyimide orthoquinone diazide compound excellent in transparency incorporated (JP-A-3-209478) is known.

By such methods, it has been made possible to obtain a positive photosensitive polyimide resin which can be developed by an alkali aqueous solution and which is excellent in sensitivity and developability.

However, from the viewpoint of the surface water repellency characteristics, the coating film thereof will usually have a high surface energy, good wettability with water or an organic solvent, or with an ink containing a dye or pigment, and its contact angle will usually be low, since it contains phenolic hydroxyl groups, carboxyl groups, thiophenol groups, sulfonic groups, etc. in the polyimide resin.

On the other hand, display devices for various displays employing liquid crystal display elements or organic EL display elements, have found a remarkable development by virtue of the excellent characteristics such as small sizes, light weights, low power consumption, etc. Accordingly, in order to further improve the display quality, requirements for the components to be used have become increasingly severe. Among them, the technology for preparing a substrate for a full color display employing an ink jet system has been actively studied in recent years. For example, with respect to the preparation of a color filter in a liquid crystal display device, as opposed to the conventional printing, electrodeposition, dying or pigment-dispersing method, a color filter and a method for its production wherein preliminarily patterned partitions (hereinafter referred to as banks) for defining pixels, are formed of a light-shielding photosensitive resin layer, and ink droplets are dropped in openings defined by such banks, have been proposed (JP-A-10-206627, JP-A-11-326625, JP-A-2000-187111). Further, also with respect to an organic EL display device, a method has been proposed wherein banks are preliminarily prepared, and an ink to form a luminescent layer is likewise dropped to prepare an organic EL display device (JP-A-11-54270).

However, in a case where ink droplets are to be dropped to areas defined by banks by an ink jet method, it is necessary to let the substrate have an affinity to ink and to let the surface of banks have an ink repellency, in order to prevent overflow of ink droplets to adjacent pixels beyond banks.

To accomplish such an object, it is considered possible to let the substrate have an affinity to ink and to let the banks have an ink repellency by continuous plasma treatment, but such has a drawback that the process will be cumbersome. Further, there has been a case wherein a fluorinated polymer other than a fluorinated surfactant or polyimide, is incorporated to the photosensitive organic thin film, but such can hardly be regarded as practical because of many problems to be solved including not only the photosensitivity but also the coating properties such as the compatibility and the amount of incorporation.

The present invention has been made in view of the above-mentioned circumstances and it proposes to add a polyimide or a polyamic acid excellent in compatibility optionally and in a small amount to a positive photosensitive polyimide to provide a novel positive photosensitive resin composition which can be developed by an alkali aqueous solution and wherein the water repellency at the surface is improved and additional functions are imparted, while maintaining the excellent sensitivity and developability and the excellent characteristic such that the film reduction during the development or postbaking is less.

DISCLOSURE OF THE INVENTION

The present inventors have conducted an extensive study to solve the above problems and as a result, have arrived at the present invention.

Namely, the present invention provides a positive photosensitive polyimide resin composition comprising (a) a solvent-soluble polyimide containing repeating units represented by the following formula (1):

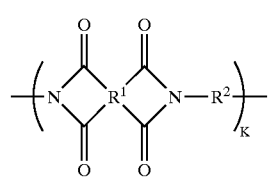

(1)

(wherein $R^1$ is a tetravalent organic group constituting a tetracarboxylic acid or its derivative, $R^2$ is a bivalent organic group constituting a diamine, provided that from 1 to 100 mol % of $R^2$ has one or more of at least one member selected from the group consisting of a phenolic hydroxyl group, a carboxyl group, a thiophenol group and a sulfonic group, and K is an integer) and having a reduced viscosity of from 0.05 to 5.0 dl/g (at a concentration of 0.5 g/dl in N-methylpyrrolidone at a temperature of 30° C.), (b) a photosensitive orthoquinonediazide compound, and (c1) a solvent-soluble polyimide containing repeating units represented by the following formula (2):

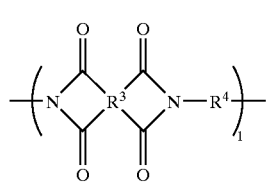

(2)

(wherein $R^3$ is a tetravalent organic group constituting a tetracarboxylic acid or its derivative, $R^4$ is a bivalent organic group constituting a diamine, provided that from 1 to 100 mol % of $R^4$ has one or more of at least one member selected from the group consisting of a long chain alkyl group having at least 6 carbon atoms and a fluorinated alkyl group, and 1 is an integer) and having a reduced viscosity of from 0.05 to 5.0 dl/g (at a concentration of 0.5 g/dl in N-methylpyrrolidone at a temperature of 30° C.), or (c2) a polyamic acid containing repeating units represented by the following formula (3):

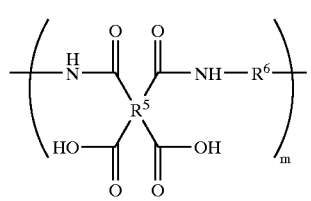

(3)

(wherein $R^5$ is a tetravalent organic group constituting a tetracarboxylic acid or its derivative, $R^6$ is a bivalent organic group constituting a diamine, provided that from 1 to 100 mol % of $R^6$ has one or more of at least one member selected from the group consisting of a long chain alkyl group having at least 6 carbon atoms and a fluorinated alkyl group, and m is an integer) and having a reduced viscosity of from 0.05 to 5.0 dl/g (at a concentration of 0.5 g/dl in N-methylpyrrolidone at a temperature of 30° C.), wherein component (c1) or component (c2) is from 0.1 to 50 wt %, based on the total weight of all polymers.

BEST MODE FOR CARRYING OUT THE INVENTION

Now, the present invention will be described in detail.

With the positive photosensitive resin composition of the present invention, etching by an alkali aqueous solution is easy, and it is possible to easily obtain a polyimide resin coating film having a relief pattern which is fine and has a high dimensional precision, by exposure by means of a mask having a prescribed pattern. Further, the obtained coating film has a characteristic such that it is excellent in the surface water repellency.

Among the above characteristics, firstly, in order to impart the alkali solubility and the positive photosensitivity, (a) a solvent-soluble polyimide having alkali solubility imparted, and (b) the photosensitive orthoquinone diazide compound, are essential components, and secondly, in order to impart the surface water repellency, (c1) the solvent-soluble polyimide having water repellency imparted or (c2) the polyamic acid having water repellency imparted, is an essential component.

The methods for obtaining the solvent-soluble polyimide and polyamic acid as components of the present invention, are not particularly limited. However, usually, a diamine is reacted or polymerized with a tetracarboxylic dianhydride or a dicarboxylic acid dihalide, as a tetracarboxylic acid or its derivative, to obtain a polyamic acid, and further the polyamic acid is dehydrated for ring closure to obtain a polyimide.

Particularly, to obtain a polyamic acid, it is common to react or polymerize a diamine with a tetracarboxylic dianhydride (which hereinafter may sometimes be referred to simply as an acid anhydride) in a polar solvent such as N-methylpyrrolidone.

In such a case, the ratio of the mols of the diamine to the total mols of the acid anhydride is preferably from 0.8 to 1.2.

Like in a usual polycondensation reaction, as this molar ratio is closer to 1, the polymerization degree of the resulting polymer tends to increase. If the polymerization degree is too small, the strength of the film tends to be inadequate. On the other hand, if the polymerization degree is too large, the operation efficiency at the time of preparing the polyimide film may sometimes be poor. Accordingly, the polymerization degree of the product in the present invention is preferably such that the reduced viscosity is from 0.05 to 5.0 dl/g (at a concentration of 0.5 g/dl in N-methyl pyrrolidone at a temperature of 30° C.), particularly preferably from 0.2 to 2.0 dl/g.

The temperature for the reaction of the diamine with the acid anhydride may be selected at an optional level within a range of from −20 to 150° C., preferably from −5 to 10° C.

The polar solvent which may be used for the reaction of the diamine with the acid anhydride, may, for example, be N,N-dimethylformamide, N,N-dimethylacetamide, N-methylpyrrolidone, n-vinylpyrrolidone, N-methylcaprolactam, dimethyl sulfoxide, tetramethyl urea, pyridine, dimethyl sulfone, hexamethyl sulfoxide, m-cresol or γ-butyrolactone. These solvents may be used alone or in combination as a mixture. Further, even a solvent incapable of dissolving the polyamic acid may be used as mixed to the above solvent within a range wherein the polyamic acid formed by the polymerization reaction, will not precipitate.

The polyamic acid thus obtained may be used as it is, or it may be precipitated in a poor solvent such as methanol or ethanol, isolated and recovered for use.

Further, to convert the polyamic acid to a polyimide, the polyamic acid may be heated to from 150° C. to 250° C. in its solution state, for dehydration/ring closure. In order to remove water formed by the dehydration/ring closure, toluene or xylene may be added for azeotropic dehydration.

Further, catalytic imidation is available as a more convenient method for converting the polyamic acid to a polyimide.

In such a case, acetic anhydride and a tertiary amine such as triethylamine, pyridine, isoquinoline or imidazole, may be added to the polyimide precursor solution, and imidation may be carried out at an optional temperature of from 0° C. to 200° C.

This method requires no special heating or no cumbersome operation to remove water formed by dehydration/ring closure and thus is known as an effective method for converting a polyamic acid to a polyimide. However, it is known to have a drawback such that in the case of a polyimide resin having hydroxyl groups, the hydroxyl groups tend to react with highly reactive acetic anhydride, and this method cannot be used (JP-A-64-33133).

With respect to component (a) of the present invention, this method can be employed only when in the bivalent organic group constituting R² in the formula (1), it has one or more of at least one group selected from the group consisting of a carboxyl group and a sulfonic group, and it does not have a phenolic hydroxyl group or a thiophenol group.

Component (a): Solvent-Soluble Polyimide

The diamine constituting R² in the formula (1) is required to be a diamine wherein from 1 to 100 mol % has one or more of at least one member selected from the group consisting of a phenolic hydroxyl group, a carboxyl group, a thiophenol group and a sulfonic group, in order to impart alkali solubility, and from 0 to 99 mol % may be a diamine having no such a group within a range not to impair the alkali solubility and the solvent solubility.

Now, specific examples of the diamine having a phenolic hydroxyl group, a carboxyl group, a thiophenol group or a sulfonic group, or the diamine having no such a group. However, the present invention is by no means thereby restricted, and they may be used alone or in combination of a plurality of them.

The diamine having a phenolic hydroxyl group may, for example, be 2,4-diaminophenol, 3,5-diaminophenol, 2,5-diaminophenol, 4,6-diaminoresorcinol, 2,5-diaminohydroquinone, bis(3-amino-4-hydroxyphenyl)ether, bis(4-amino-3-hydroxyphenyl)ether, bis(4-amino-3,5-dihydroxyphenyl)ether, bis(3-amino-4-hydroxyphenyl)methane, bis(4-amino-3-hydroxyphenyl)methane, bis(4-amino-3,5-dihydroxypheny)methane, bis(3-amino-4-hydroxyphenyl)sulfone, bis(4-amino-3-hydroxyphenyl)sulfone, bis(4-amino-3,5-dihydroxyphenyl)sulfone, 2,2-bis(3-amino-4-hydroxyphenyl)hexafluoropropane, 2,2-bis(4-amino-3-hydroxyphenyl)hexafluoropropane, 2,2-bis(4-amino-3,5-dihydroxyphenyl)hexafluoropropane, 4,4'-diamino-3,3'-dihydroxybiphenyl, 4,4'-diamino-3,3'-dihydroxy-5,5'-dimethylbiphenyl, 4,4'-diamino-3,3'-dihydroxy-5,5'-dimethoxybiphenyl, 1,4-bis(3-amino-4-hydroxyphenoxy)benzene, 1,3-bis(3-amino-4-hydroxyphenoxy)benzene, 1,4-bis(4-amino-3-hydroxyphenoxy)benzene, 1,3-bis(4-amino-3-hydroxyphenoxy)benzene, bis[4-(3-amino-4-hydroxyphenoxy)phenyl]sulfone, 2,2-bis[4-(3-amino-4-hydroxyphenoxy)phenyl]propane, or 2,2-bis[4-(3-amino-4-hydroxyphenoxy)phenyl]hexafluoropropane.

The diamine having a carboxyl group may, for example, be 2,4-diamino benzoic acid, 2,5-diamino benzoic acid, 3,5-diamino benzoic acid, 4,6-diamino-1,3-benzene dicarboxylic acid, 2,5-diamino-1,4-benzene dicarboxylic acid, bis(4-amino-3-carboxyphenyl)ether, bis(4-amino-3,5-dicarboxyphenyl)ether, bis(4-amino-3-carboxyphenyl)sulfone, bis(4-amino-3,5-dicarboxyphenyl)sulfone, 4,4'-diamino-3,3'-dicarboxybiphenyl, 4,4'-diamino-3,3'-dicarboxy-5,5'-dimethylbiphenyl, 4,4'-diamino-3,3'-dicarboxy-5,5'-dimethoxybiphenyl, 1,4-bis(4-amino-3-carboxyphenoxy)benzene, 1,3-bis(4-amino-3-carboxyphenoxy)benzene, bis[4-(4-amino-3-carboxyphenoxy)phenyl]sulfone, 2,2-bis[4-(4-amino-3-carboxyphenoxy)phenyl]propane or 2,2-bis[4-(4-amino-3-carboxyphenoxy)phenyl]hexafluoropropane.

The diamine having a thiophenol group may, for example, be 1,3-diamino-4-mercaptobenzene, 1,3-diamino-5-mercaptobenzene, 1,4-diamino-2-mercaptobenzene, bis(4-amino-3-mercaptophenyl)ether, or 2,2-bis(3-amino-4-mercaptophenyl)hexafluoropropane.

The diamine having a sulfonic group may, for example, be 1,3-diaminobenzene-4-sulfonic acid, 1,3-diaminobenzene-5-sulfonic acid, 1,4-diaminobenzene-2-sulfonic acid, bis(4-aminobenzene-3-sulfonic acid)ether, 4,4'-diaminobiphenyl-3,3'-disulfonic acid, or 4,4'-diamino-3,3'-dimethylbiphenyl-6,6'-disulfonic acid.

Further, one having a plurality of such groups may, for example, be bis(4-amino-3-carboxy-5-hydroxyphenyl)ether, bis(4-amino-3-carboxy-5-hydroxyphenyl)methane, bis(4-amino-3-carboxy-5-hydroxyphenyl)sulfone, 2,2-bis(4-amino-3-carboxy-5-hydroxyphenyl)propane, or 2,2-bis(4-amino-3-carboxy-5-hydroxyphenyl)hexafluoropropane.

Further, in order to obtain a solvent-soluble polyimide resin which can easily be produced by catalytic imidation, a diamine having a carboxyl group or a sulfonic group, is preferred.

The above diamine having no group for imparting alkali solubility, may, for example, be p-phenylenediamine, m-phenylenediamine, 4,4-methylene-bis(2,6-ethylaniline), 4,4'-methylene-bis(2-isopropyl-6-methylaniline), 4,4'-methylene-bis(2,6-diisopropylaniline), 2,4,6-trimethyl-1,3-phenylenediamine, 2,3,5,6-tetramethyl-1,4-phenylenediamine, o-tolidine, m-tolidine, 3,3',5,5'-tetramethylbenzidine, bis[4-(3-aminophenoxy)phenyl]sulfone, 2,2-bis[4-(3-aminophenoxy)phenyl]propane, 2,2-bis[4-(3-aminophenoxy)phenyl]hexafluoropropane, 4,4'-diamino-3,3'-dimethyldicyclohexylmethane, 4,4'-diaminodiphenyl ether, 3,4-diaminodiphenyl ether, 4,4'-diaminodiphenylmethane, 2,2-bis(4-anilino) hexafluoropropane, 2,2-bis(3-anilino)hexafluoropropane, 2,2-bis(3-amino-4-toluyl)hexafluoropropane, 1,4-bis(4-aminophenoxy)benzene, 1,3-bis(4-aminophenoxy)benzene, bis[4-(4-aminophenoxy)phenyl]sulfone, 2,2-bis[4-(4-aminophenoxy)phenyl]propane, or 2,2-bis[4-(4-aminophenoxy)phenyl]hexafluoropropane.

Preferred from the viewpoint of the solvent solubility of the polyimide, is, for example, 4,4'-methylene-bis(2,6-ethylaniline), 4,4'-methylene-bis(2-isopropyl-6-methylaniline), 4,4'-methylene-bis(2,6-diisopropylaniline), bis[4-(3-aminophenoxy)phenyl]sulfone, 2,2-bis[4-(3-aminophenoxy)phenyl]propane, or 2,2-bis[4-(3-aminophenoxy)phenyl]hexafluoropropane.

Further, from the viewpoint of the adhesiveness of the polyimide, it is also preferred to employ a siloxane-containing diamine.

The siloxane-containing diamine may, for example, be as follows:

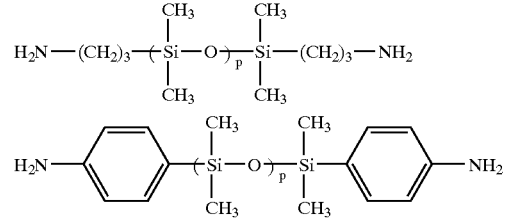

(wherein p is an integer of from 1 to 10).

With respect to the tetracarboxylic acid or its derivative constituting R¹ in the formula (1), its structure is not particularly limited so long as a solvent-soluble polyimide can be obtained. Such acids or their derivatives may be used alone or in combination as a mixture of a plurality of them.

A specific example of the acid anhydride may be an aromatic tetracarboxylic anhydride such as pyromellitic dianhydride, 3,3',4,4'-biphenyltetracarboxylic dianhydride, 3,3',4,4'-benzophenonetetracarboxylic dianhydride, 3,3',4,4'-diphenyl ether tetracarboxylic dianhydride, 2,2-bis(3,4-dicarboxyphenyl)hexafluoropropane dianhydride, or 3,3',4,4'-diphenylsulfonetetracarboxylic dianhydride.

From the viewpoint of the solubility, preferred is 3,3',4,4'-biphenyltetracarboxylic dianhydride, 3,3',4,4'- benzophenonetetracarboxylic dianhydride, 2,2-bis(3,4-dicarboxyphenyl)hexafluoropropane dianhydride, or 3,3'4,4'-diphenylsulfonetetracarboxylic dianhydride.

Further, an alicyclic tetracarboxylic dianhydride such as 1,2,3,4-cyclobutanetetracarboxylic dianhydride, 1,2-dimethyl-1,2,3,4-cyclobutanetetracarboxylic dianhydride, 1,2,3,4-tetramethyl-1,2,3,4-cyclobutanetetracarboxylic dianhydride, 1,2,3,4-cyclopentanetetracarboxylic dianhydride, 1,2,4,5-cyclohexanetetracarboxylic dianhydride, 3,4-dicarboxy-1,2,3,4-tetrahydro-1-naphthalene succinic dianhydride, 2,3,5-tricarboxy-2-cyclopentane acetic dianhydride, bicyclo[2.2.2]oct-7-ene-2,3,5,6-tetracarboxylic dianhydride, 2,3,4,5-tetrahydrofurantetracarboxylic dianhydride or 3,5,6-tricarboxy-2-norbornane acetic dianhydride, or an aliphatic tetracarboxylic acid dianhydride such as 1,2,3,4-butanetetracarboxylic dianhydride, may be mentioned.

From the viewpoint of the solubility of the polyimide, particularly preferred is an acid anhydride made of a tetracarboxylic acid wherein four carbonyl groups are not directly bonded to an aromatic ring, such as 1,2,3,4-cyclobutanetetracarboxylic dianhydride, 1,2-dimethyl-1,2,3,4-cyclobutanetetracarboxylic dianhydride, 1,2,3,4-tetramethyl-1,2,3,4-cyclobutanetetracarboxylic dianhydride, 1,2,3,4-cyclopentanetetracarboxylic dianhydride, 1,2,4,5-cyclohexanetetracarboxylic dianhydride, 3,4-dicarboxy-1,2,3,4-tetrahydro-1-naphthalene succinic dianhydride, 2,3,5-tricarboxy-2-cyclopentane acetic dianhydride, bicyclo[2.2.2]oct-7-ene-2,3,5,6-tetracarboxylic dianhydride, 2,3,4,5-tetrahydrofurantetracarboxylic dianhydride, or 3,5,6-tricarboxy-2-norbornane acetic dianhydride.

Further, in order to obtain a polyimide resin having high transparency, 1,2,3,4-cyclobutanetetracarboxylic dianhydride is preferred.

Component (b): Photosensitive Orthoquinonediazide

The orthoquinone diazide compound is a compound essential to impart the positive photosensitivity to the resin composition of the present invention. The orthoquinonediazide compound is not particularly limited and may be a compound containing an orthoquinonediazide group in its molecule. It may, for example, be an orthobenzoquinonediazide compound, an orthonaphthoquinonediazide compound or an orthoquinolinequinonediazide compound. Among them, it is common to employ an orthonaphthoquinonediazide compound.

The above orthoquinonediazide compound is used usually in the form of an orthoquinonediazidosulfonyl compound.

Such an orthoquinonediazidosulfonyl compound is usually obtained by a condensation reaction of orthoquinonediazidosulfonyl chloride with a compound having a phenolic hydroxyl group or an amino group.

The orthoquinonediazidosulfonyl component constituting the orthoquinonediazidosulfonyl chloride, may, for example, be 1,2-naphthoquinone-2-diazido-4-sulfonyl, 1,2-naphthoquinone-2-diazido-5-sulfonyl, or 1,2-nephthoquinone-2-diazido-6-sulfonyl.

Whereas, the compound to be reacted with the orthoquinonediazidosulfonyl chloride, may, for example, be a phenol compound, such as phenol, hydroquinone, resorcinol, catechol, phloroglucinol, 2,4-dihydroxybenzophenone, 2,3,4-trihydroxybenzophenone, 2,2',4,4'-tetrahydroxybenzophenone, 2,3,4,4'-tetrahydroxybenzophenone, 2,2',3,4,4'-pentahydroxybenzophenone, 2',4'-dihydroxyacetophenone, 2',5'-dihydroxyacetophenone, 2',6'-dihydroxyacetophenone, 3',5'-dihydroxyacetophenone, 2',3',4'-trihydroxyacetophenone, 2',4',6'-trihydroxyacetophenone, 2,2-bis(4-hydroxyphenyl)propane, 2,2-bis(4-hydroxyphenyl)hexafluoropropane, bis(4-hydroxyphenyl)methane, bis(4-hydroxyphenyl)sulfone, 4,4'-biphenyldiol, 2,2-bis(2,3,4-trihydroxyphenyl)propane, or 4,4'-dihydroxyphenylsulfone.

Further, an aromatic amine such as aniline, m-phenylenediamine, p-phenylenediamine, 4,4'-diaminodiphenyl ether, or 4,4'-diaminodiphenylmethane, may be mentioned.

Further, an aminophenol such as 4-aminophenol, 3-aminophenol, 1,3-diamino-4-hydroxybenzene, 1,3-diamino-5-hydroxybenzene, 1,3-diamino-4,6-dihydroxybenzene, or 2,2-bis(3-amino-4-hydroxyphenyl)hexafluoropropane, may be mentioned.

Particularly, from the viewpoint of the solubility, the orthoquinonediazide compound is preferably a 1,2-naphthoquinone-2-diazido-4-sulfonic acid ester, a 1,2-naphthoquinone-2-diazido-5-sulfonic acid ester or a 1,2-naphthoquinone-2-diazido-6-sulfonic acid ester. These compounds may be used alone or in combination as a mixture of two or more of them.

Component (c1): Solvent-Soluble Polyimide

The diamine constituting $R^4$ in the formula (2) is required to be such that from 1 to 100 mol % has one or more of at least one group selected from the group consisting of a long chain alkyl group having at least 6 carbon atoms, and a fluorinated alkyl group, in order to impart water repellency, and from 0 to 90 mol % may be one having no such a group within a range not to impair the water repellency. Such diamines may be used alone or in combination as a mixture of a plurality of them.

Further, in order to obtain the desired water repellency, the carbon number is preferably at least 6, more preferably from 12 to 20.

The diamine having a long chain alkyl group having at least 6 carbon atoms or a fluorinated alkyl group, is not to particularly limited so long as it has a long chain alkyl group or a fluorinated alkyl group in its molecule. A specific example of the diamine having a long chain alkyl group or a fluorinated alkyl group may be a long chain alkyl group-containing diamine such as 4-hexyloxy-1,3-diaminobenzene, 4-octyloxy-1,3-diaminobenzene, 4-decyloxy-1,3-diaminobenzene, 4-dodecyloxy-1,3-diaminobenzene, 4-hexadecyloxy-1,3-diaminobenzene, 4-octadecyloxy-1,3-diaminobenzene, 4,6-bishexyloxy-1,3-diaminobenzene, 5-(hexyloxymethyl)-1,3-diaminobenzene, 5-(1-octyloxymethyl)-1,3-diaminobenzene, 5-(1-decyloxymethyl)-1,3-diaminobenzene, 5-(1-dodecyloxymethyl)-1,3-diaminobenzene, 5-(1-hexadecyloxymethyl)-1,3-diaminobenzene, 5-(1-octadecyloxymethyl)-1,3-diaminobenzene, 4,6-bisoctyloxy-1,3-diaminobenzene, 4,6-bisdecyloxy-1,3-diaminobenzene, 4,6-bisdodecyloxy-1,3-diaminobenzene, 4,6-bishexadecyloxy-1,3-diaminobenzene, 4,6-bisoctadecyloxy-1,3-diaminobenzene, hexyl-3,5-diaminobenzoate, octyl-3,5-diaminobenzoate, decyl-3,5-diaminobenzoate, dodecyl-3,5-diaminobenzoate, hexadecyl-3,5-diaminobenzoate or octadecyl-3,5-diaminobenzoate, or a fluorinated alkyl group-containing diamine such as 4-perfluorohexyl-1,3-diaminobenzene, 4-perfluorooctyl-1,3-diaminobenzene, 4-perfluorodecyl-1,3-diaminobenzene, 5-(2,2,3,3,3-pentafluoropropyl-1-oxymethyl)-1,3-diaminobenzene, 5-(1H,1H,2H,2H-heptadecafluorodecyl-1-oxymethyl)-1,3-diaminobenzene, 4-perfluorodecyl-1,3-diaminobenzene, 2,2,3,3,3-pentafluoropropyl-3,5-diaminobenzoate or 1H,1H,2H,2H-heptadecafluorodecyl-3,5-diaminobenzoate.

The diamine having no long chain alkyl group or fluorinated alkyl group, to be used within a range not to impair the water repellency of the present invention, may, specifically, be, for example, p-phenylene diamine, m-phenylene diamine, 4,4-methylene-bis(2,6-ethylaniline), 4,4'-methylene-bis(2-isopropyl-6-methylaniline), 4,4'-methylene-bis(2,6-diisopropylaniline), 2,4,6-trimethyl-1,3-phenylene diamine, 2,3,5,6-tetramethyl-1,4-phenylene diamine, o-tolidine, m-tolidine, 3,3',5,5'-tetramethylbenzidine, bis[4-(3-aminophenoxy)phenyl] sulfone, 2,2-bis[4-(3-aminophenoxy)phenyl]propane, 2,2-bis[4-(3-aminophenoxy)phenyl]hexafluoropropane, 4,4'-diamino-3,3'-dimethyldicyclohexylmethane, 4,4'-diaminodiphenyl ether, 3,4-diaminodiphenyl ether, 4,4'-diaminodiphenylmethane, 2,2-bis(4-anilino) hexafluoropropane, 2,2-bis(3-anilino)hexafluoropropane, 2,2-bis(3-amino-4-toluyl)hexafluoropropane, 1,4-bis(4-aminophenoxy)benzene, 1,3-bis(4-aminophenoxy)benzene, bis[4-(4-aminophenoxy)phenyl]sulfone, 2,2-bis[4-(4-aminophenoxy)phenyl]propane, or 2,2-bis[4-(4-aminophenoxy)phenyl]hexafluoropropane.

From the viewpoint of the solubility of the polyimide, preferred is 4,4'-methylene-bis(2,6-ethylaniline), 4,4'-methylene-bis(2-isopropyl-6-methylaniline), 4,4'-methylene-bis(2,6-diisopropylaniline), bis[4-(3-aminophenoxy)phenyl]sulfone, 2,2-bis[4-(3-aminophenoxy)phenyl]propane, or 2,2-bis[4-(3-aminophenoxy)phenyl]hexafluoropropane. However, the preferred is not limited thereto, and in view of the reactivity, it is, of course, preferred to use p-phenylene diamine or m-phenylene diamine.

Further, from the viewpoint of the adhesiveness of the polyimide, a siloxane-containing diamine is also preferred.

The siloxane-containing diamine component may, for example, be as follows:

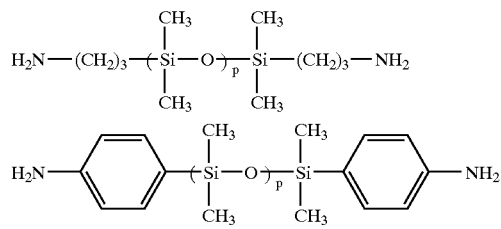

(wherein p is an integer of from 1 to 10).

The tetracarboxylic acid or its derivative constituting $R^3$ in the formula (2), is not particularly limited, but in consideration of the transparency and the solvent solubility, an alicyclic or aliphatic one is preferred. Such acids or their derivatives may be used alone or in combination as a mixture of a plurality of them.

A specific example of such an alicyclic or aliphatic acid anhydride may be an alicyclic tetracarboxylic dianhydride, such as 1,2,3,4-cyclobutanetetracarboxylic dianhydride, 1,2-dimethyl-1,2,3,4-cyclobutanetetracarboxylic dianhydride, 1,2,3,4-tetramethyl-1,2,3,4-cyclobutanetetracarboxylic dianhydride, 1,2,3,4-cyclopentanetetracarboxylic dianhydride, 1,2,4,5-cyclohexanetetracarboxylic dianhydride, 3,4-dicarboxy-1,2,3,4-tetrahydro-1-naphthalene succinic dianhydride, 2,3,5-tricarboxy-2-cyclopentane acetic dianhydride, bicyclo[2.2.2]oct-7-ene-2,3,5,6-tetracarboxylic dianhydride, 2,3,4,5-tetrahydrofurantetracarboxylic dianhydride or 3,5-6-tricarboxy-2-norbornane acetic dianhydride, or an aliphatic tetracarboxylic dianhydride such as 1,2,3,4-butanetetracarboxylic dianhydride.

Particularly from the viewpoint of the transparency and the solvent solubility, preferred is 1,2,3,4-cyclobutanetetracarboxylic dianhydride or 3,4-dicarboxy-1,2,3,4-tetrahydro-1-naphthalene succinic dianhydride.

Component (c2): Polyamic Acid

The diamine constituting $R^6$ in the formula (3) is required to be such that from 1 to 100 mol % has one or more of at least one member selected from the group consisting of a long chain alkyl group having at least 6 carbon atoms and a fluorinated alkyl group, in order to impart water repellency, and from 0 to 99 mol % may be one having no such a group within a range not to impair the water repellency. Such diamines may be used alone or in combination as a mixture of a plurality of them.

Further, in order to obtain the desired water repellency, the carbon number is preferably at least 6, more preferably from 12 to 20.

The diamine having a long chain alkyl group having at least 6 carbon atoms or a fluorinated alkyl group, is not particularly limited so long as it has a long chain alkyl group or a fluorinated alkyl group in its molecule. A specific example of the diamine having a long chain alkyl group or a fluorinated alkyl group, may be the above-mentioned diamine having a long chain alkyl group or a fluorinated alkyl group, as exemplified for the diamine constituting $R^4$ in the formula (2).

Further, likewise, the diamine having no long chain alkyl group or fluorinated alkyl group, to be used within a range not to impair the water repellency in the present invention, may be the diamine having no long chain alkyl group or fluorinated alkyl group, as exemplified for the diamine constituting $R^4$ in the formula (2).

The tetracarboxylic acid or its derivative constituting $R^5$ in the formula (3) is not particularly limited. Such acids or their derivatives may be used alone or in combination as a mixture of a plurality of them.

A specific example of the acid anhydride may be an aromatic tetracarboxylic anhydride, such as pyromellitic dianhydride, 3,3',4,4'-biphenyltetracarboxylic dianhydride, 3,3',4,4'-benzophenonetetracarboxylic dianhydride, 3,3',4,4'-diphenyl ether tetracarboxylic dianhydride, 2,2-bis(3,4-dicarboxyphenyl)hexafluoropropane dianhydride, or 3,3',4,4'-diphenylsulfonetetracarboxylic dianhydride, an alicyclic tetracarboxylic dianhydride such as 1,2,3,4-cyclobutanetetracarboxylic dianhydride, 1,2-dimethyl-1,2,3,4-cyclobutanetetracarboxylic dianhydride, 1,2,3,4-tetramethyl-1,2,3,4-cyclobutanetetracarboxylic dianhydride, 1,2,3,4-cyclopentanetetracarboxylic dianhydride, 1,2,4,5-cyclohexanetetracarboxylic dianhydride, 3,4-dicarboxy-1,2,3,4-tetrahydro-1-naphthalene succinic dianhydride, 2,3,5-tricarboxy-2-cyclopentane acetic dianhydride, bicyclo[2.2.2]oct-7-ene-2,3,5,6-tetracarboxylic dianhydride, 2,3,4,5-tetrahydrofurantetracarboxylic dianhydride or 3,5-6-tricarboxy-2-norbornane acetic dianhydride, or an aliphatic tetracarboxylic dianhydride such as 1,2,3,4-butanetetracarboxylic dianhydride.

Particularly, from the viewpoint of the transparency, preferred is 1,2,3,4-cyclobutanetetracarboxylic dianhydride, 1,2-dimethyl-1,2,3,4-cyclobutanetetracarboxylic dianhydride, 1,2,3,4-tetramethyl-1,2,3,4-cyclobutanetetracarboxylic dianhydride, 1,2,3,4-cyclopentanetetracarboxylic dianhydride, 1,2,4,5-cyclohexanetetracarboxylic dianhydride, 3,4-dicarboxy-1,2, 3,4-tetrahydro-1-naphthalene succinic dianhydride, 2,3,5-tricarboxy-2-cyclopentane acetic dianhydride, bicyclo [2.2.2]oct-7-ene-2,3,5,6-tetracarboxylic dianhydride, 2,3,4, 5-tetrahydrofurantetracarboxylic dianhydride, or 3,5,6-tricarboxy-2-norbornane acetic acid dianhydride.

Composition of the Present Invention

To obtain the positive photosensitive polyimide resin composition of the present invention, (a) the solvent-soluble polyimide represented by the formula (1), (b) the photosensitive orthoquinone diazide compound, and (c1) the solvent-soluble polyimide represented by the formula (2) or (c2) the polyamic acid represented by the formula (3), may be mixed or added, and the method is not particularly limited.

At that time, the amount of component (c1) or (c2) to be incorporated, may optionally be adjusted to adjust the water repellency of the coating film, but it is preferably from 0.1 to 50 wt %, more preferably from 0.1 to 20 wt %, based on the total weight of all polymers. If this blend amount is large, the alkali developability may deteriorate, and the effects of the present invention may not sufficiently be obtained.

Further, the amount of component (b) to be incorporated, is preferably from 1 to 100 parts by weight, per 100 parts by weight of component (a). If the amount is less than 1 part by weight, the sensitivity of the resulting composition at the time of exposure, tends to be remarkably low, whereby no pattern can be formed. On the other hand, if it exceeds 100 parts by weight, the mechanical property, electric characteristics, etc., of the film formed by the resulting composition, tend to deteriorate.

When used in a liquid crystal display device, an EL display device, etc., the positive photosensitive polyimide resin composition of the present invention may be employed in the form of a solution as dissolved in an organic solvent.

Such an organic solvent is not particularly limited, so long as it is capable of uniformly dissolving components (a), (b) and (c1) or (c2).

Specifically, it may, for example, be N,N-dimethylformamide, N,N-dimethylacetamide, N-methylpyrrolidone, N-vinylpyrrolidone, N-methylcaprolactam, dimethylsulfoxide, tetramethyl urea, pyridine, dimethylsulfone, hexamethylsulfoxide, m-cresol, or λ-butyrolactone.

Further, other organic solvents may be used in combination depending upon the purpose such as the coating or printing property to the substrate or the storage stability, so long as the solubility of the composition will not be impaired. Specific examples of such organic solvents include ethylcellosolve, butylcellosolve, ethylcarbitol, butylcarbitol, ethylcarbitol acetate, butylcarbitol acetate, ethylene glycol, ethyl lactate, butyl lactate, cyclohexanone and cyclopentanone.

The concentration of the solution of the positive photosensitive polyimide resin composition is not particularly limited, so long as the respective components are uniformly dissolved in the organic solvent. It is usually within a range of from 1 to 50 wt %, from the viewpoint of efficiency in processing.

The positive photosensitive polyimide resin composition of the present invention may be spin-coated on a substrate such as a glass substrate provided with an ITO film, a glass substrate provided with a $SiO_2$ film or a glass substrate provided with a Cr film, followed by preliminary drying at a temperature of from 50 to 130° C. to form a film. In such a case, it is, of course, preferred to employ a substrate treated with a silane type coupling agent or the like.

On such a film, a mask having a prescribed pattern is overlaid, then light is irradiated, followed by development with an alkali developer, whereby the exposed portion will be washed off, and a relief pattern having a sharp edge surface can be obtained.

It is common that an ultrahigh pressure mercury lamp is used as the light source, and by interposing a spectral filter between the light source and the mask, i-line (365 nm), h-line (405 nm), g-line (436 nm) or the like may be spectrally irradiated. With the positive photosensitive polyimide resin composition of the present invention, a pattern may be formed by using light with any one of these wavelengths.

Further, the method for transferring the mask pattern to the photosensitive polyimide resin composition of the present invention may be proximity exposure or contact exposure employing a contact aligner, or reduced projection exposure employing a stepper.

The developer to be used for development may be any developer so long as it is an alkali aqueous solution, and it may, for example, be an aqueous solution of an alkali metal hydroxide such as potassium hydroxide or sodium hydroxide, an aqueous solution of quaternary ammonium hydroxide such as tetramethylammonium hydroxide, tetraethylammonium hydroxide or choline, or an aqueous solution of an amine such as ethanolamine, propylamine or ethylenediamine. Further, to such a developer, a surfactant or the like may be added.

Such a developer may be used at a temperature of from 5 to 50° C. However, with the composition of the present invention, the solubility of the exposed portion is high, and development can easily be carried out at room temperature by means of common 2.38 wt % tetramethylammonium hydroxide.

The substrate having a relief pattern thus obtained, is subjected to heat treatment at a temperature of from 200 to 400° C., whereby it is possible to obtain a polyimide coating film which is excellent in heat resistance, chemical resistance and electrical characteristics and which has a good relief pattern.

The composition of the present invention has positive photosensitive characteristics with high sensitivity and high resolution and yet can easily be etched by an alkali aqueous solution, and by carrying out exposure by means of a mask having a prescribed pattern, a polyimide resin coating film having a relief pattern with a fine shape and high dimensional precision can easily be obtained. Further, it is possible to obtain a coating film excellent in the surface water repellency.

The positive photosensitive polyimide resin composition of the present invention is particularly suitable for use as a light-shielding material or a partition wall material suitable for an ink jet system in a liquid crystal display or an EL display.

Now, the present invention will be described in further detail with reference to Examples, but it should be understood that the present invention is by no means restricted thereto.

EXAMPLE 1

Preparation of a Polyimide Resin Composition 2.74 g of 1,3-diamino-5-benzoic acid, 18.16 g of bis[4-(3-aminophenoxy)phenyl]sulfone and 11.53 g of 1,2,3,4-cyclobutanetetracarboxylic dianhydride were reacted in 183.80 g of N-methylpyrrolidone (hereinafter referred to simply as NMP) at room temperature for 6 hours. The reaction solution was diluted with NMP to a solid content of 6.0 wt %, and then, acetic anhydride and pyridine were added, whereupon a dehydration/ring closure reaction was carried out at 40° C. for two hours. This solution was put into methanol, followed by filtration and drying to obtain a polyimide powder (A) having a number average molecular weight of 38,000 (k=70 as calculated by repeating units).

The reduced viscosity was 1.0 dl/g (at a concentration of 0.5 g/dl in N-methylpyrrolidone at a temperature of 30° C.).

Further, 5.52 g of p-phenylenediamine, 3.39 g of 4-octadecyloxy-1,3-diaminobenzene and 18.02 g of 3,4-dicarboxy-1,2,3,4-tetrahydro-1-naphthalenesuccinic dianhydride, were reacted in 152.60 g of NMP at room temperature for 6 hours. The reaction solution was diluted with NMP to a solid content of 6.0 wt %, and then, acetic anhydride and pyridine were added, whereupon a dehydration/ring closure reaction was carried out at 40° C. for two hours. This solution was put into methanol, followed by filtration and drying to obtain a polyimide powder (C) having a number average molecular weight of 17,000 (1=38 as calculated by repeating units). The reduced viscosity was 0.6 dl/g (at a concentration of 0.5 g/dl in N-methylpyrrolidone at a temperature of 30° C.).

The above polyimide powder (A) was dissolved in γ-butyrolactone to obtain 20 g of a solution having a resin concentration of 15%, to which 0.90 g of a photosensitive orthoquinonediazide compound (B) (an ester compound having 3 mols of 1,2-naphthoquinone-2-diazido-5-sulfonic acid substituted per 1 mol of 2,3,4,4'-tetrahydroxybenzophenone) was added, followed by stirring at room temperature for one hour, to obtain a uniform solution.

Then, a solution having the polyimide powder (C) dissolved in γ-butyrolactone to a resin concentration of 15%, was added in an amount of 0.20 g (the polyimide powder (C) based on the total weight of all polymers was 1 wt %), followed by stirring at room temperature for 6 hours, whereupon filtration was carried out by a filter of 1 μm to obtain a solution of the positive photosensitive polyimide resin composition of the present invention.

Evaluation of the Photosensitive Characteristics

This photosensitive polyimide resin solution was coated directly on a $SiO_2$-coated glass substrate by means of a spin coater and heated on a hot plate at 80° C. for 10 minutes to form a coating film having a thickness of 1.60 μm. To this coating film, ultraviolet light (light of 365 nm taken out by means of a filter) was irradiated within a range of 1000 mJ/cm² through a test mask by means of an ultraviolet irradiation apparatus (PLA-501, manufactured by Canon Inc.). After the exposure, development was carried out by immersion in an alkali developer (NMD-3, manufactured by TOKYO OHKA KOGYO CO., LTD.) at 23° C. for 120 seconds, followed by rinsing with pure water for 20 seconds. As a result, a pattern formation was confirmed at the portion irradiated with a light exposure of at least 340 mJ/cm². The film thickness after the development was 1.60 μm. The pattern resolution was such that the pattern was formed up to a line/space of 4 μm without peeling of the pattern. The obtained film was heated in a circulating drying furnace at 170° C. for 30 minutes and at 250° C. for 1 hour to obtain a polyimide pattern having a thickness of 1.39 μm.

Evaluation of the Water Repellency

The solution of the positive photosensitive resin composition of the present invention was coated directly on a $SiO_2$-coated glass substrate by means of a spin coater and heated on a hot plate at 80° C. for 10 minutes to obtain a coating film having a thickness of 1.60 μm. To this coating film, ultraviolet light (light of 365 nm taken out by means of a filter) was irradiated within a range of 1000 mJ/cm² through a mask by means of an ultraviolet irradiation apparatus. After the exposure, development was carried out by immersion in an alkali developer at 23° C. for 120 seconds, followed by rinsing with pure water for 20 seconds. The thickness after the development was 1.39 μm. The obtained film was heated in a circulating drying furnace at 170° C. for 30 minutes and at 250° C. for 1 hour to obtain a uniform polyimide coating film having a thickness of 1.65 μm. The contact angles of water and methylene iodide on this coating film were measured and were found to be 63.1° and 30.8°, respectively. Further, the surface energy of the coating film was calculated by the following calculation.

$$(1+\cos\theta) \times \gamma_L = 2(\gamma_S^d \times \gamma_L^d)^{1/2} + 2(\gamma_S^p \times \gamma_L^p)^{1/2}$$

$$\gamma_L = \gamma_L^d + \gamma_L^p$$

$$\gamma_S = \gamma_S^d + \gamma_S^p$$

$\theta$: contact angle of liquid on the coating film
$\gamma_L$: surface energy of liquid
$\gamma_L^d$: dispersion term of surface energy of liquid
$\gamma_L^p$: polarity term of surface energy of liquid
$\gamma_S$: surface energy of coating film
$\gamma_S^d$: dispersion term of surface energy of coating film
$\gamma_S^p$: polarity term of surface energy of coating film Here, the contact angle of water is represented by $\theta_1$, and the contact angle of methylene iodide is represented by $\theta_2$, and the surface energy of water ($\gamma_L=72.8$, $\gamma_L^d=29.1$, $\gamma_L^p=43.7$) {dyn/cm} and the surface energy of methylene iodide ($\gamma_L=50.8$, $\gamma_L^d=46.8$, $\gamma_L^p=4.0$) {dyn/cm} are substituted, to obtain the following formulae:

$$(1+\cos\theta_1) \times 72.8 = 2(\gamma_S^d \times 29.1)^{1/2} + 2(\gamma_S^p \times 43.7)^{1/2}$$

$$(1+\cos\theta_2) \times 50.8 = 2(\gamma_S^d \times 46.8)^{1/2} + 2(\gamma_S^p \times 4.0)^{1/2}$$

By substituting the measured values for $\theta_1$ and $\theta_2$, respectively, to have the above formulae equated simultaneously, $\gamma_S^d$ and $\gamma_S^p$ will be obtained.

As a result, the surface energy of the coating film was 45.6 dyn/cm. Further, the contact angles of water and methylene iodide on the $SiO_2$ coated substrate at the exposed portion, were 40.7° and 6.9°, respectively, and the surface energy was 58.9 dyn/cm.

EXAMPLE 2

A solution of a positive photosensitive polyimide resin composition was obtained in the same manner as in Example 1 except that in Example 1, 0.20 g of the solution having the polyimide powder (C) dissolved in γ-butyrolactone to a resin concentration of 15%, was changed to 1.05 g (the polyimide powder (C) based on the total weight of all polymers was 5 wt %). Using the prepared solution of the positive photosensitive resin composition, a coating film having a thickness of 1.65 μm was obtained in the same manner as in Example 1. As a result, formation of a pattern was confirmed at the portion irradiated with a light exposure of at least 400 mJ/cm². The film thickness after the development was about 1.65 μm. The pattern resolution was such that the pattern was formed up to a line/space of 5 μm without peeling of the pattern. The obtained film was heated in a circulating drying furnace at 170° C. for 30 minutes and at 250° C. for 60 minutes to obtain a polyimide pattern having a thickness of 1.42 μm. The contact angles of water and methylene iodide obtained in the same manner as in Example 1, were 73.1° and 38.0°, respectively, and the surface energy was 40.8 dyn/cm. Further, the contact angles of water and methylene iodide on the $SiO_2$-coated substrate at the exposed portion, were 43.1° and 14.8°, respectively, and the surface energy was 57.2 dyn/cm.

COMPARATIVE EXAMPLE 1

A solution of a positive photosensitive polyimide resin composition was obtained in the same manner as in Example 1 except that no polyimide powder (C) was added in Example 1.

Using the prepared solution of the positive photosensitive resin composition, a coating film having a thickness of 1.52 μm, was obtained in the same manner as in Example 1. As a result, formation of a pattern was confirmed at the portion irradiated with light exposure of at least 400 mJ/cm². The film thickness after the development was about 1.49 μm. The pattern resolution was such that the pattern was formed up to a line/space of 5 μm without peeling of the pattern. The obtained film was dried in a circulating drying furnace at 170° C. for 30 minutes and 250° C. for 60 minutes to obtain a polyimide pattern having a thickness of 1.32 μm. The contact angles of water and methylene iodide obtained in the same manner as in Example 1, were 43.6° and 12.5°, respectively, and the surface energy was 57.1 dyn/cm. Further, the contact angles of water and methylene iodide on the $SiO_2$ coated substrate at the exposed portion, were 43.5° and 6.3°, respectively, and the surface energy was 57.6 dyn/cm.

INDUSTRIAL APPLICABILITY

By using the positive photosensitive resin composition of the present invention, it is possible to obtain a uniform coating film having the surface water repellency improved, while maintaining the properties of a positive photosensitive resin which can be developed by an alkali aqueous solution and which is excellent in sensitivity and developability. This positive photosensitive resin composition is particularly suitable for use as a light-shielding material or a partition wall material suitable for an ink jet system in a liquid crystal display or an EL display.

What is claimed is:

1. A positive photosensitive polyimide resin composition, comprising:

(a) a solvent-soluble polyimide containing repeating units represented by the following formula (1):

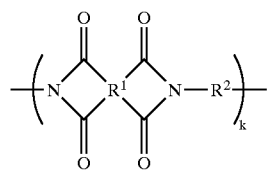

(1)

wherein $R^1$ is a tetravalent organic group derived from a tetracarboxylic acid or a derivative thereof, $R^2$ is a bivalent organic group derived from a diamine, provided that from 1 to 100 mol % of $R^2$ units have at least one functional group selected from the group consisting of a phenolic hydroxyl group, a carboxyl group, a thiophenol group and a sulfonic group, and k is an integer, the polyimide having a reduced viscosity ranging from 0.05 to 5.0 dl/g as measured at a concentration of 0.5 g/dl in N-methylpyrrolidone at a temperature of 30° C.;

(b) a photosensitive orthoquinonediazide compound; and (c) from 0.1 to 50 wt %, based on the total weight of all polymers of the composition, of a component (c1) or (c2), wherein:

component (c1) is a solvent-soluble polyimide containing repeating units represented by the following formula (2):

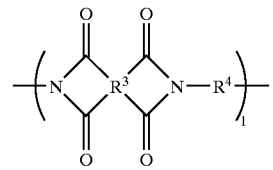

(2)

wherein $R^3$ is a tetravalent organic group derived from a tetracarboxylic acid or derivative thereof, $R^4$ is a bivalent organic group derived from a diamine, provided that from 1 to 100 mol % of $R^4$ units have at least one functional group selected from the group consisting of a long chain alkyl group having at least 6 carbon atoms and a fluorinated alkyl group, and l is an integer, the polyimide having a reduced viscosity ranging from 0.05 to 5.0 dl/g as measured at a concentration of 0.5 g/dl in N-methylpyrrolidone at a temperature of 30° C.; and component (c2) is a polyamic acid containing repeating units represented by the following formula (3):

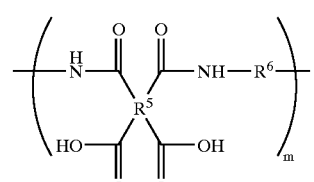

(3)

wherein $R^5$ is a tetravalent organic group derived from a tetracarboxylic acid or a derivative thereof, $R^6$ is a bivalent organic group derived from a diamine, provided that from 1 to 100 mol % of $R^6$ units have at least one functional group selected from the group consisting of a long chain alkyl group having at least 6 carbon atoms and a fluorinated alkyl group, and m is an integer, the polyamic acid having a reduced viscosity ranging from 0.05 to 5.0 dl/g as measured at a concentration of 0.5 g/dl in N-methylpyrrolidone at a temperature of 30° C.

2. The positive photosensitive polyimide resin composition according to claim 1, wherein component (b) is present in the composition in an amount ranging from 1 to 100 parts by weight, per 100 parts by weight of component (a).

3. The positive photosensitive polyimide resin composition according to claim 1, wherein component (b) is at least one compound selected from the group consisting of a 1,2-naphthoquinonediazide-4-sulfonic acid ester, a 1,2-naphthoquinonediazide-5-sulfonic acid ester and a 1,2-naphthoquinonediazide-6-sulfonic acid ester.

4. The positive photosensitive polyimide resin composition according to claim 1, wherein $R^1$ in the formula (1) contains a tetravalent organic group derived from 1,2,3,4-cyclobutanetetracarboxylic acid or a derivative thereof.

5. The positive photosensitive polyimide resin composition according to claim 1, wherein $R^3$ in formula (2) or $R^5$ in formula (3) contains a tetravalent organic group derived from an alicyclic or aliphatic tetracarboxylic acid or a derivative thereof.

6. The positive photosensitive polyimide resin composition according to claim 1, wherein $R^3$ in formula (2) contains a tetravalent organic group derived from 3,4-dicarboxyl,1,2,3,4tetrahydronaphthalenesuccinic acid or a derivative thereof.

7. The positive photosensitive polyimide resin composition according to claim 1, wherein the divalent moiety $R^4$ in formula (2) is comprised of bivalent units derived from p-phenylenediamine.

8. The positive photosensitive polyimide resin composition according to claim 1, wherein $R^5$ in the formula (3) is comprised of a tetravalent organic group derived from 1,2,3,4-cyclobutanetetracarboxylic acid or a derivative thereof.

9. The positive photosensitive polyimide resin composition according to claim 1, wherein moiety $R^2$ is derived from a diamine substituted by a hydroxyl group that is selected from the group consisting of 2,4-diaminophenol, 3,5-diaminophenol, 2,5-diaminophenol, 4,6-diaminoresorcinol, 2,5-diaminohydroquinone, bis-(3-amino-4-hydroxyphenyl)ether, bis-(4-amino-3-hydroxyphenyl)ether, bis-(4-amino-3,5-dihydroxyphenyl)ether, bis-(3-amino-4-hydroxyphenyl)methane, bis-(4-amino-3-hydroxyphenyl)methane, bis-(4-amino-3,5-dihydroxyphenyl)methane, bis-(3-amino-4-hydroxyphenyl)sulfone, bis-(4-amino-3-hydroxyphenyl)sulfone, bis-(4-amino-3,5-dihydroxyphenyl)sulfone, 2,2-bis-(3-amino-4-hydroxyphenyl)hexafluoropropane, 2,2-bis(4-amino-3-hydroxyphenyl)hexafluoropropane, 2,2-bis(4-amino-3,5-dihydroxyphenyl)hexafluoropropane, 4,4'-diamino-3,3'-dihydroxybiphenyl, 4,4'-diamino-3,3'-dihydroxy-5,5'-dimethylbiphenyl, 4,4'-diamino-3,3'-dihydroxy-5,5'dimethoxybiphenyl, 1,4-bis(3-amino-4-hydroxyphenoxy)benzene, 1,3-bis(3-amino-4-hydroxyphenoxy)benzene, 1,4-bis(4-amino-3-hydroxyphenoxy)benzene, 1,3-bis(4-amino-3-hydroxyphenoxy)benzene, bis[4-(3-amino-4-hydroxyphenoxy)phenyl]sulfone, bis[4-(3-amino-4-hydroxyphenoxy)phenyl]propane and 2,2-bis[4-(3-amino-4-hydroxyphenoxy)phenyl]hexafluoropropane.

10. The positive photosensitive polyimide resin composition according to claim 1, wherein moiety $R^2$ is derived from a diamine substituted by a carboxyl group that is selected from the group consisting of 2,4-diamino benzoic acid, 2,5-diamino benzoic acid, 2,5-diamino benzoic acid, 4,6-diamino-1,3-benzenedicarboxylic acid, 2,5-diamino-1,4-benzenedicarboxylic acid, bis-(4-amino-3-carboxyphenyl)ether, bis-(4-amino-3,5-dicarboxyphenyl)ether, bis-(4-amino-3-carboxyphenyl)sulphone, bis-(4-amino-3,5-dicarboxyphenyl)sulphone, 4,4'-diamino-3,3'-dicarboxybiphenyl, 4,4'-diamino-3,3'-dicarboxy-5,5'-dimethylbiphenyl, 4,4'-diamino-3,3'-dicarboxy-5,5'-dimethoxybiphenyl, 1,4-bis(4-amino-3-carboxyphenoxy)benzene, 1,3-bis(4-amino-3-carboxyphenoxy)benzene, bis[4-(4-amino-3-carboxyphenoxy)phenyl]sulfone, bis[4-(4-amino-3-carboxyphenoxy)phenyl]propane and 2,2-bis[4-(4-amino-3-carboxyphenoxy)phenyl]hexafluoropropane.

11. The positive photosensitive polyimide resin composition according to claim 1, wherein moiety $R^2$ is derived from a diamine substituted by a thiol group that is selected from the group consisting of 1,3-diamino-4-mercaptobenzene, 1,3-diamino-5-mercaptobenzene, 1,4-diamino-2-mercaptobenzene, bis-(4-amino-3-mercaptophenyl)ether and 2,2-bis(3-amino-4-mercaptophenyl)hexafluoropropane.

12. The positive photosensitive polyimide resin composition according to claim 1, wherein moiety $R^2$ is derived from a diamine substituted by a sulfonic acid group that is selected from the group consisting of 1,3-diaminobenzene-4-sulfonic acid, 1,3-diaminobenzene-5-sulfonic acid, 1,4-diaminobenzene-2-sulfonic acid, bis-(4-aminobenzene-3-sulfonic acid)ether, 4,4'-diaminobiphenyl-3,3'-disulfonic acid and 4,4'-diamino-3,3'-dimethylbiphenyl-6,6-disulfonic acid.

13. The positive photosensitive polyimide resin composition according to claim 1, wherein moiety $R^1$ is derived from a tetracarboxylic dianhydride that is selected from the group consisting of pyromellitic dianhydride, 3,3',4,4'-biphenyltetracarboxylic dianhydride, 3,3',4,4'benzophenonetetracarboxylic dianhydride, 3,3',4,4'-diphenyl ether tetracarboxylic dianhydride, 3,3',4,4'-diphenylsulfonetetracarboxylic dianhydride, 2,2-bis(3,4-dicarboxyphenyl)hexafluoropropane dianhydride and 3,3',4,4'-diphenylsulfonetetracarboxylic dianhydride.

14. The positive photosensitive polyimide resin composition according to claim 1, wherein moiety $R^1$ is derived from an alicyclic tetracarboxylic dianhydride that is selected from the group consisting of 1,2,3,4-cyclobutanetetracarboxylic dianhydride, 1,2-dimethyl-1,2,3,4-cyclobutanetetracarboxylic dianhydride, 1,2,3,4-tetramethyl-1,2,3,4-cyclobutanetetracarboxylic dianhydride, 1,2,3,4-cyclopentanetetracarboxylic dianhydride, 1,2,3,5-cyclohexanetetracarboxylic dianhydride, 3,4-dicarboxy-1,2,3,4-tetrahydro-1-naphthalene succinic dianhydride, 2,3,5-tricarboxy-2-cyclopentane acetic dianhydride, bicyclo[2.2.2]oct-7-ene-2,3,5,6-tetracarboxylic dianhydride, 2,3,4,5-tetrahydrofurantetracarboxylic dianhydride and 3,5,6-tricarboxy-2-norbornane acetic dianhydride or is 1,2,3,4-butanetetracarboxylic dianhydride.

15. The positive photosensitive polyimide resin composition according to claim 1, wherein moiety $R^4$ is derived from a diamine substituted by a long chain alkyl group that is selected from the group consisting of 4-hexyloxyl-1,3-diaminobenzene, 4-octyloxy-1,3-diaminobenzene, 4-decyloxy-1,3-diaminobenzene, 4-dodecyloxy-1,3-diaminobenzene, 4-hexadecyloxy-1,3-diaminobenzene, 4-octadecyloxy-1,3-diaminobenzene, 4,6-bishexyloxy-1,3-diaminobenzene, 5-(hexyloxymethyl)-1,3-diaminobenzene, 5-(1-octyloxymethyl)-1,3-diaminobenzene, 5-(1-decyloxymethyl)-1,3-diaminobenzene, 5-(1-dodecyloxymethyl)-1,3-diaminobenzene, 5-(1-hexadecyloxymethyl)-1,3-diaminobenzene, 5-(1-octadecyloxymethyl)-1,3-diaminobenzene, 4,6-bisoctyloxy-1,3-diaminobenzene, 4,6-bisdecyloxy-1,3-diaminobenzene, 4,6-bisdodecyloxy-1,3-diaminobenzene, 4,6-bishexadecyloxy-1,3-diaminobenzene, 4,6-bisoctadecyloxy-1,3-diaminobenzene, hexyl-3,5-diaminobenzoate, octyl-3,5-diaminobenzoate, decyl-3,5-diaminobenzoate, dodecyl-3,5-diaminobenzoate, hexadecyl-3,5-diaminobenzoate and octadecyl-3,5-diaminobenzoate.

16. The positive photosensitive polyimide resin composition according to claim 1, wherein moiety $R^4$ is derived from a diamine substituted by a fluorinated alkyl group that is selected from the group consisting of 4-perfluorohexyl-1,3-diaminobenzene, 4-perfluorooctyl-1,3-diaminobenzene, 4-perfluorodecyl-1,3-diaminobenzene, 5-(2,2,3,3-pentafluoropropyl-1-oxymethyl)-1,3-diaminobenzene, 5-(1H,1H,2H,2H-heptadecafluorodecyl-1-oxymethyl)-1,3-diaminobenzene, 4-perfluorodecyl-1,3-diaminobenzene, 2,2,3,3-pentafluoropropyl-3,5-diaminobenzoate and 1H,1H,2H,2H-heptadecafluorodecyl-3,5-diaminobenzoate.

* * * * *